(12) United States Patent
Savage et al.

(10) Patent No.: US 6,249,177 B1
(45) Date of Patent: Jun. 19, 2001

(54) METHOD, CIRCUIT AND/OR ARCHITECTURE FOR REDUCING GATE OXIDE STRESS IN LOW-VOLTAGE REGULATED DEVICES

(75) Inventors: Derrick J. Savage; Satish C. Saripella, both of Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/672,396

(22) Filed: Sep. 28, 2000

(51) Int. Cl.[7] ....................................................... G05F 3/02
(52) U.S. Cl. .............................. 327/546; 307/29; 307/86; 326/83
(58) Field of Search ................................. 307/28, 29, 85, 307/86, 87; 327/540, 545, 546; 326/83

(56) References Cited

U.S. PATENT DOCUMENTS 6,127,848 * 10/2000 Wert et al. ............................ 326/81

* cited by examiner

*Primary Examiner*—Shawn Riley
(74) *Attorney, Agent, or Firm*—Christopher P. Maiorana, P.C.

(57) ABSTRACT

An apparatus comprising a first circuit, a second circuit and a switch. The first circuit may be configured to receive a first supply voltage and may be coupled to a first ground. The second circuit may be configured to receive a second supply voltage and may be coupled to a second ground. The second circuit may be disabled in response to a control signal. The first and second supply voltages may be controlled by a reference voltage. The switch may be coupled between the first and second circuits and may be configured to connect the first and second circuits when the second circuit is disabled.

20 Claims, 3 Drawing Sheets

METHOD, CIRCUIT AND/OR ARCHITECTURE FOR REDUCING GATE OXIDE STRESS IN LOW-VOLTAGE REGULATED DEVICES

FIELD OF THE INVENTION

The present invention relates to a method and/or architecture for providing a supply voltage to low-voltage devices generally and, more particularly, to a method and/or architecture for providing a supply voltage while reducing gate oxide stress in low-voltage devices.

BACKGROUND OF THE INVENTION

Conventional approaches for regulated devices implement independent regulators for analog portions (i.e., phase lock loops (PLLs)) and digital portions(i.e., logic core) of a circuit. With independent regulators, switching in the core does not affect the PLL devices. However, providing separate reference voltages requires additional overhead.

It is desirable to provide a circuit to prevent gate oxide breakdown of regulated, thin-oxide devices in a PLL when another device, implemented on the same integrated circuit (IC), is operated when the PLL is powered down.

SUMMARY OF THE INVENTION

The present invention concerns an apparatus comprising a first circuit, a second circuit, and a switch. The first circuit may be configured to receive a first supply voltage and may be coupled to a first ground. The second circuit may be configured to receive a second supply voltage and may be coupled to a second ground. The second circuit may be disabled in response to a control signal. The first and second supply voltages may be controlled by a common reference voltage. The switch may be coupled between the first and second circuits and may be configured to connect the first and second circuits when the second circuit is disabled.

The objects, features and advantages of the present invention include providing a method and/or architecture for reducing gate oxide stress in low-voltage devices that may (i) improve reliability, particularly with low-voltage, thin-oxide, regulated devices in circuits such as PLLs; (ii) provide an increased margin to avoid excess gate-oxide stress; (iii) implement a simple design without a need for managing the design of an additional regulator; and/or (iv) provide an implementation that saves die size compared with implementing an additional regulator.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
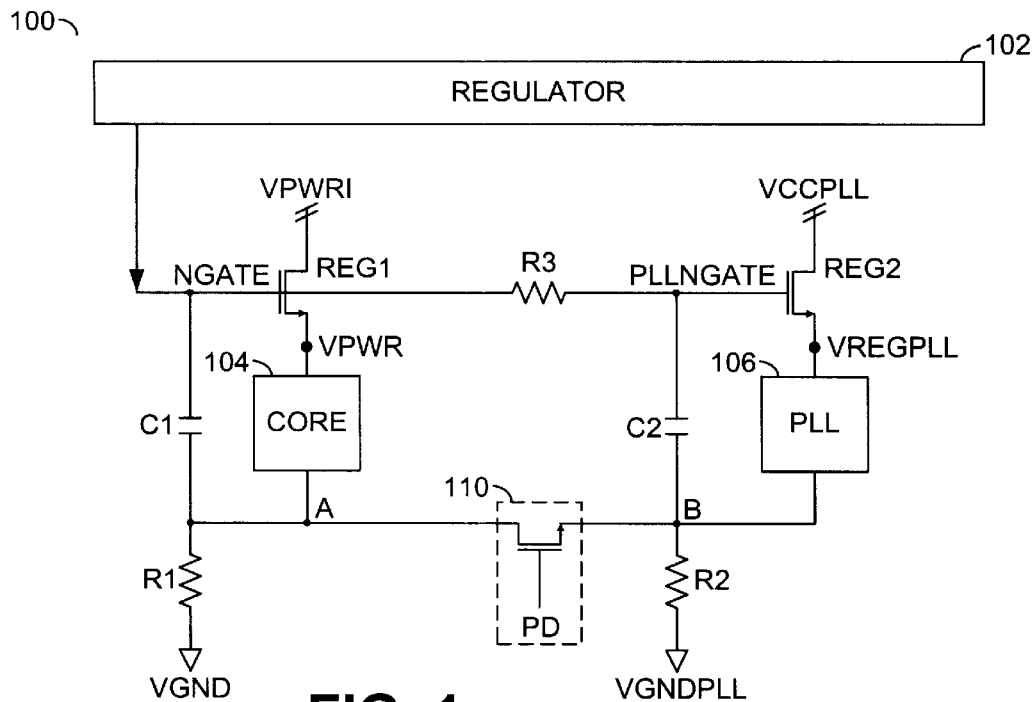
FIG. 1 is a diagram of preferred embodiment of the present invention.

Referring to FIG. 1, a block diagram of a circuit 100 is shown in accordance with a preferred embodiment of the present invention. The circuit 100 generally comprises a regulator 102, a block (or circuit) 104 and a block (or circuit) 106. In one example, the block 104 may be implemented as a core. However, the block 104 may be implemented as any circuit operating at a particular voltage. In one example, the block 106 may be implemented as a phase lock loop (PLL). However, the block 106 may be implemented as any circuit operating independently of the circuit 104.

The circuit 104 generally receives a first regulated power supply (e.g., VPWR). The regulated supply VPWR may be received through a switch (e.g., REG1 ) connected to a supply voltage (e.g., VPWRI). The switch REG1 may be controlled by a control voltage (e.g., NGATE). The control voltage NGATE may be generated by the regulator 102. By sizing the switch REG1, the regulated power supply VPWR may be controlled. The circuit 104 is generally connected to a first ground (e.g., VGND) through a resistor (e.g., R1 ). A capacitor (e.g., C1) may also be connected between the signal NGATE and the resistor R1 to provide filtering.

The circuit 106 generally receives a second regulated supply voltage (e.g., VREGPLL) from a switch (e.g., REG2) connected to a supply voltage (e.g., VCCPLL). A signal (e.g., PLLNGATE) may control the switch REG2. The signal NGATE may be presented to a first terminal of a resistor (e.g., R3). The signal PLLNGATE may be presented at a second terminal of the resistor R3 in response to the signal NGATE. A capacitor (e.g., C2) may be connected between the signal PLLNGATE and a first terminal of a resistor (e.g., R2). A second terminal of the resister R2 may be connected to a second ground (e.g., VGNDPLL). The capacitor C2 and the resistor R2 may provide filtering of the signal PLLNGATE. The circuit 106 may require a different operating condition than the circuit 104. The circuit 106 may be disabled while the circuit 104 is active. Disabling the circuit 106 while the circuit 104 is active may affect the operating voltage of the circuit 106.

A switch 110 may be implemented to connect the paths to ground (either VGND or VGNDPLL) of the circuit 104 and the circuit 106. The switch 110 is shown implemented as an NMOS switch inserted between a first node (e.g., A) and a second node (e.g., B). The switch 110 may be implemented to connect the circuit 104 to the circuit 106 when the circuit 106 is powered down. Such a connection couples node B to node A and may reduce the stress on the gate oxide layer of the circuit 106.

Designs that contain regulated voltage supplies have potential reliability risks related to the operation of thin-oxide low-voltage devices. For example, the regulator 102 may generate a reference voltage level NGATE used to generate the internal supply voltages VPWR and VREGPLL for the circuit 104 and the circuit 106, respectively. To achieve the required performance, some circuits, such as PLLs, may require devices of different (e.g., thin) oxide thickness. In one process technology, an oxide may be considered thin around 40 Å, while an oxide may be considered thick around 70 Å. However, the magnitude of a thin oxide device may vary according to the particular process technology implemented. In the circuit 100, thin-oxide devices may be operating at voltage levels near the maximum that the gate oxide can withstand before experiencing reliability issues due to the effects of oxide stress. Such a situation may occur, for example, when the circuit 106 is implemented as a PLL and is powered down. The present invention generally reduces the amount of gate oxide stress (via the switch 110) imposed on the thin-oxide devices in the circuit 106.

The reference voltage NGATE may be generated by the regulator 102 with reference to the chip supply VPWRI. The circuit 104 is generally then supplied by the regulated power supply VPWR generated from a large NMOS device (e.g., the device REG1) having a gate controlled by the reference voltage NGATE. The ground of the circuit 104 is generally the same as that of the regulator 102 (e.g., the ground VGND). The circuit 106 is generally operated by the regulated power supply VREGPLL, that may be generated by a filtered version of the reference voltage NGATE (e.g., PLLNGATE). The supplies for the circuit 106 (e.g., VCCPLL and VGNDPLL) generally do not connect to the supplies of the circuit 104 and the regulator 102 (e.g., VPWRI and VGND).

During normal operation of the circuit 104, particularly when operated as a core, fast switching may occur. Averaged over time, such fast transients may appear to be a DC component imposed upon the circuit 100. The inherent resistance in the ground path (e.g., the ground VGND) may cause a potential of about 100 mV to exist at the node A that may be capacitively coupled to the reference voltage NGATE. The extra voltage is generally also coupled to the voltage PLLNGATE, thus raising the level of VREGPLL. Since the circuit 106 may be powered down, the additional charge at the regulated supply voltage VREGPLL generally cannot be dissipated. As a result, the various thin-oxide circuits in the circuit 106 may be exposed to high gate oxide stress from the effect of additional voltage induced on the thin-oxide circuits because of the higher PLLNAGATE voltage.

Since the various thin-oxide devices of the circuit 106 may be operating near the gate-oxide stress tolerance level, the switch 110 may be implemented to raise the voltage level at the node B in order to offset the effect of an increase on the reference voltage NGATE. For every 1 mV increase at the node B, the effect of a 1 mV increase on the regulated supply voltage VREGPLL across the thin-oxide devices may be offset. Thus, the node B may be raised by the same amount that the node A is raised. The switch 110 is generally gated by a power down signal (e.g., PD). The power down signal PD may be the same power down signal used to power down the circuit 106.

Figure 2:
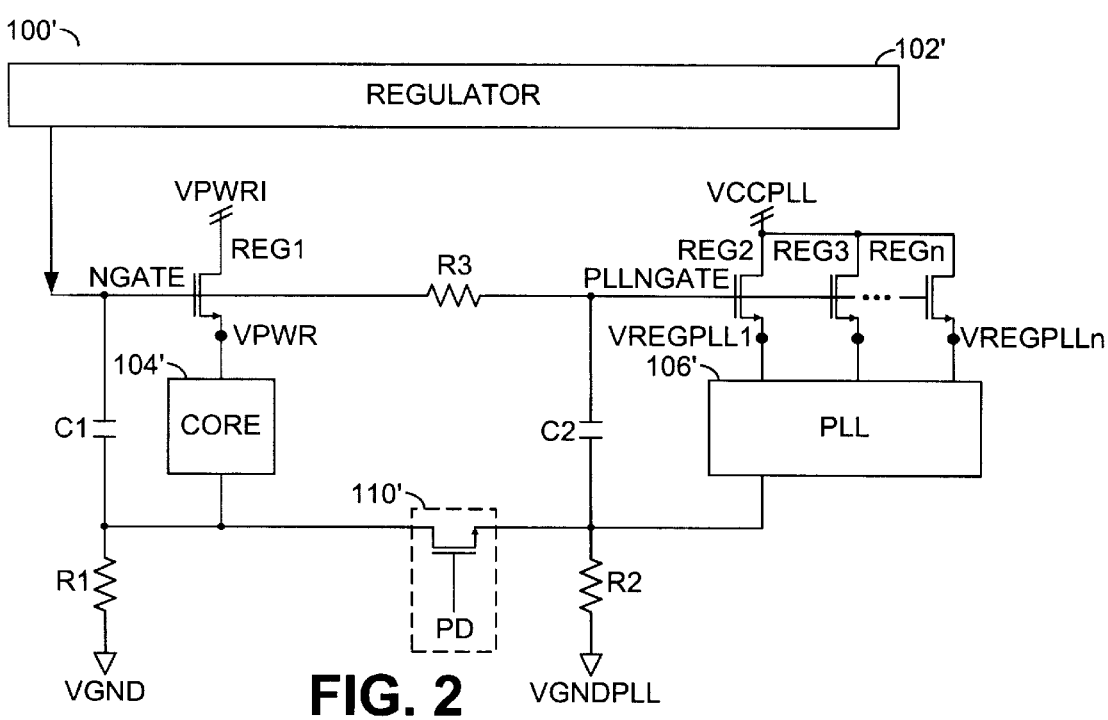
FIG. 2 is a diagram of an alternate embodiment of FIG. 1.

Referring to FIG. 2, an alternate embodiment of a circuit 100' is shown. A number of regulated supply voltages (e.g., VREGPLL1–VREGPLLN, where N is an integer) may be presented to the circuit 106'. A number of devices (e.g., REG2–REGN, where N is an integer) may be configured to each receive the voltage PLLNGATE. Any one of the regulated supply voltages VREGPLL1–VREGPLLN may cause damage to the thin-oxide circuits in the circuit 106' when the circuit 106' is powered down. By implementing the switch 110' along the ground path, each of the regulated supply voltages VREGPLL1–VREGPLLN may be protected from such gate oxide stress.

Figure 3:
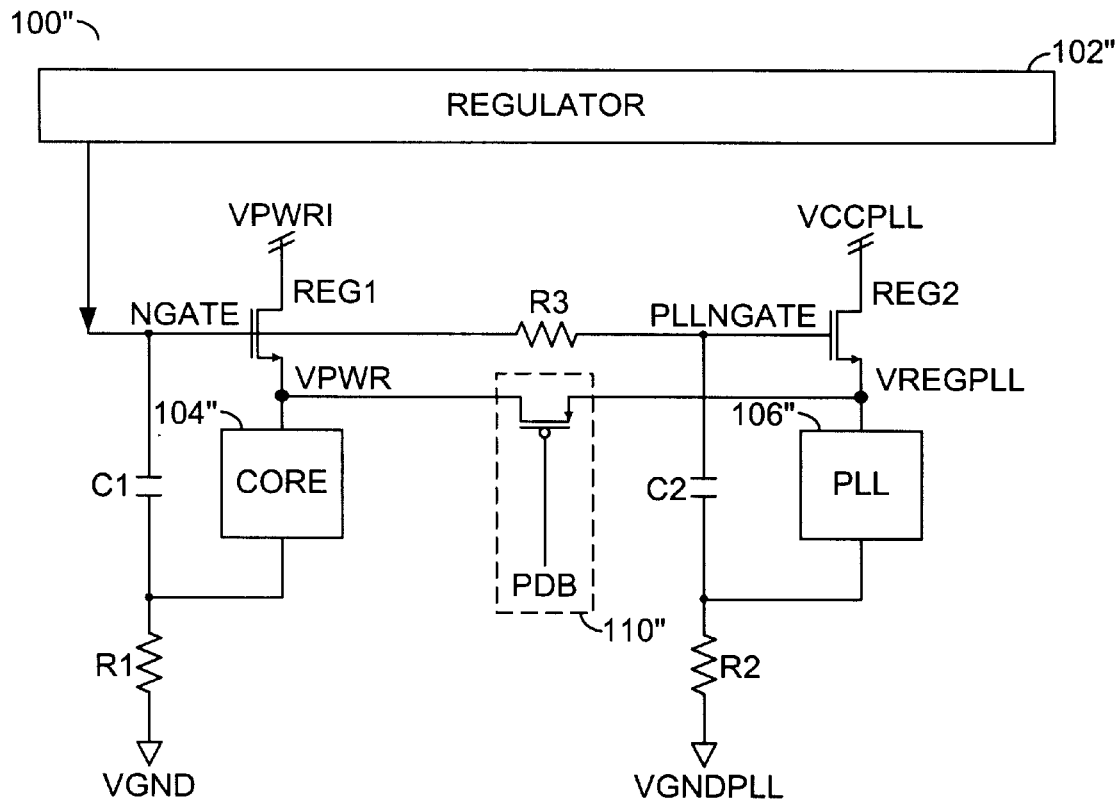
FIG. 3 is a diagram of another alternate embodiment of the present invention.

Referring to FIG. 3, another alternate example of a circuit 100" is shown in accordance with an alternate embodiment of the present invention. The switch 110" is shown connected between the regulated supply VREGPLL and the regulated supply VPWR. In this case, the switch 110" is shown implemented as a PMOS transistor. However, other transistor types may be implemented accordingly to meet the design criteria of a particular application. The switch 110" may be gated by a control signal (e.g., PDb, a logical complement of the signal PD).

Figure 4:
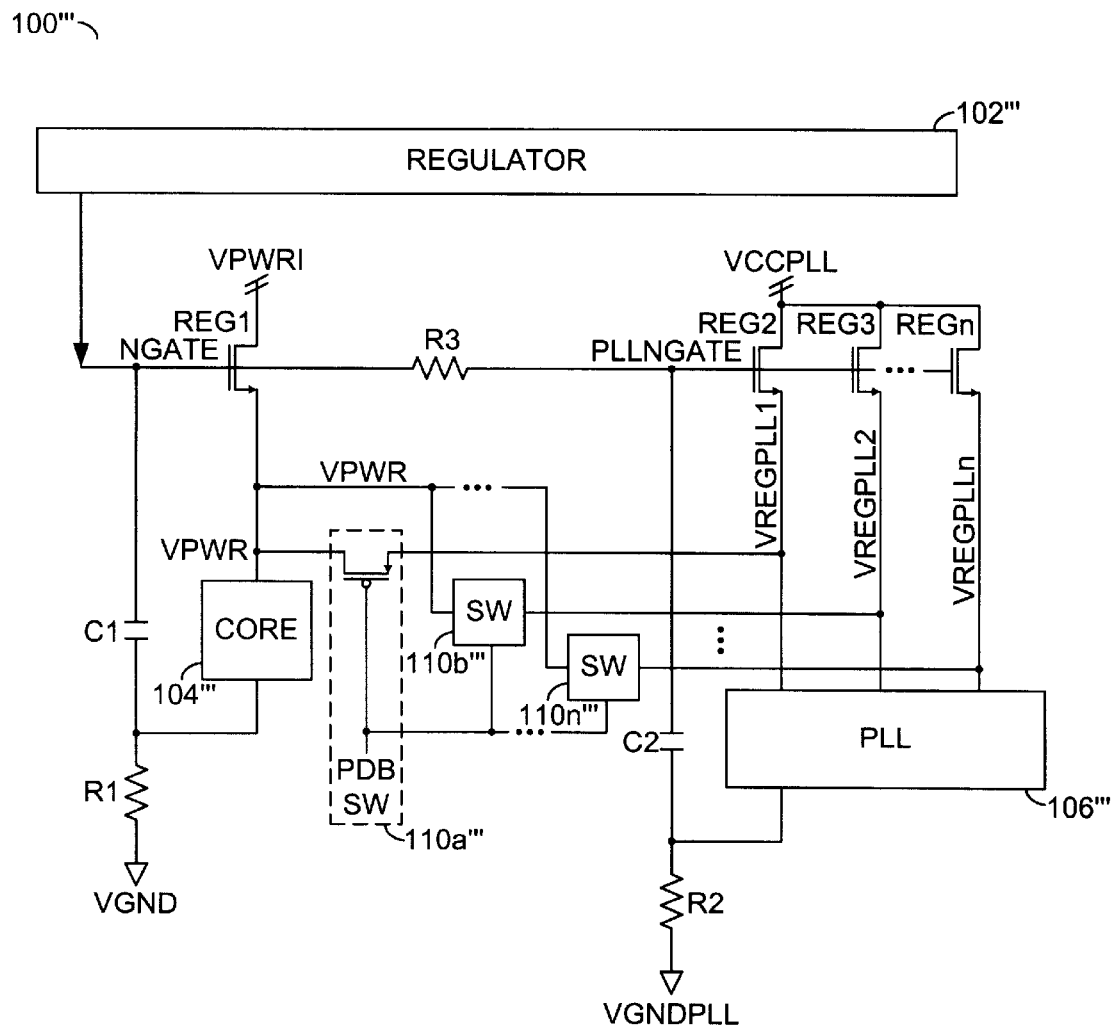
FIG. 4 is a diagram of another alternate embodiment of FIG. 2.

Referring to FIG. 4, another alternate embodiment 100'" is shown. A number of regulated supply voltages VREGPLL1–VREGPLLN are presented to the circuit 106'" through the devices REG2–REGN. Any one of the regulated supply voltages VREGPLL1–VREGPLLN may cause damage to the thin-oxide circuits of the circuit 106'" due to activity in the circuit 104. As such, a number of separate switches 110a'"–110n'" may be implemented between the voltage VPWR and a respective regulated voltage supply VREGPLL1–VREGPLLN of the circuit 106'" (e.g., switch 110a'" between VPWR and VREGPLL1, switch 110n'" between Vpwr and VREGPLLN, etc.).

Two components play a role in the effectiveness of the circuit 100. One component is the size of the switch 110. Another component is the size of the resistor R2 (e.g., the resistance value of the resistor R2 ). In general, the resistor R2 should be between about 20× and 50× greater than the resistor R1. In one process, the value of the resistors R1 and R2 should be less than 5Ω. However, in certain designs, the resistors R1 and R2 may be greater than 5Ω.

Figure 5:
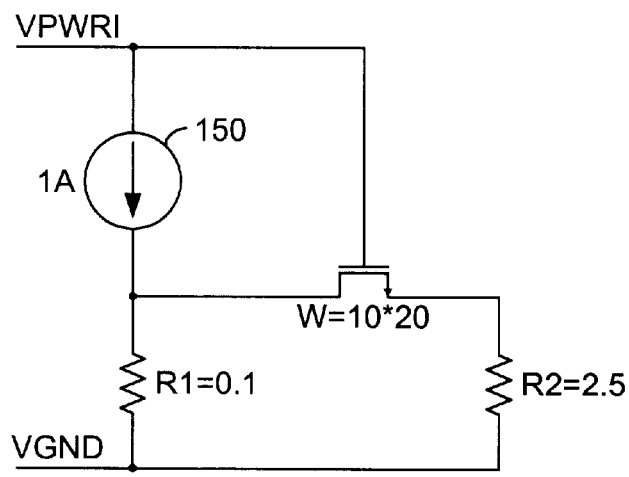
FIG. 5 is a diagram of a simulation of a switch used in the present invention.

Referring to FIG. 5, a model simulation of the switch 110 is shown. In one example, a current source 150 may provide 1 A of current and the resistor R1 may provide a resistance of about 0.1Ω while the resistor R2 may provide a resistance of about 2.5Ω. A bus resistance of resistor R1 may be determined to be 0.1Ω from the die model, assuming 1 A of current coming out of the circuit 104. A bus resistance of the resistor R2 may be estimated to be 2.5Ω based on information from die model and approximation of contact resistance. The following TABLE 1 shows the effect of varying the width of the switch 110 and the percent of the voltage at the node A that is seen at the node B:

TABLE 1

| Switch width (um) | na (V) | nb (V) | nb/na *100 (%) |
| --- | --- | --- | --- |
| 200 | 98.8415 m | 28.9624 m | 29.3019 |
| 400 | 98.2152 m | 44.6196 m | 45.4305 |
| 600 | 97.8244 m | 54.3894 m | 55.599 |
| 800 | 97.5577 m | 61.0567 m | 62.5852 |
| 1000 | 97.3643 m | 65.8933 m | 67.6771 |
| 1200 | 97.2176 m | 69.5609 m | 71.5517 |
| 1400 | 97.1025 m | 72.4368 m | 74.5983 |
| 1600 | 97.0099 m | 74.7523 m | 77.0563 |
| 1800 | 96.9337 m | 76.6563 m | 79.0811 |
| 2000 | 96.8700 m | 78.2495 m | 80.7778 |

As the width of the switch 110 is increased, more of the voltage VREGPLL is offset. For a device width of 200 um, nearly 30% of the effect is offset. A device width of 2000 um may allow for an lightly more than 80%.

The second key component is the value of the resistance R2. If the resistance of the resistor R2 is a very low resistive path (e.g, on the order of tenths-of-ohms), then the circuit 100 may be rather ineffective, since the voltage drop across the resistor R2 will generally be small. The voltage at the node B will be unable to provide much relief and an alternate solution should be used.

One such solution for a low resistive path would be to use a similar switch between the voltages VREG and VREGPLL (as illustrated in FIG. 3). The path through the switch to VREG, serves as a clamp between the voltages VREGPLL and VREG. As the regulated voltage VREG is loaded, the voltage is generally lower than the stress limits.

The shorting device (e.g., the switch 110) between the ground nodes (VGND and VGNDPLL) may be preferably implemented on the same integrated circuit as the circuit 104 and the circuit 106. The PLL on the IC may have three different nodes (as shown in FIG. 1). If a similar switch is implemented between VREG and VREGPLL, three switches would have had to be placed on the chip (as shown in FIG. 4). Any of these methods is much simpler to implement and more area advantageous than the addition of a second regulator.

There may be a limited amount of margin within the design to avoid over-stressing the gate-oxide. The methods described for avoiding over-stressing may maintain the amount of margin available. Additionally, the circuit 100 should maintain as much margin as possible.

The circuit 100 may improve reliability in chips that use regulated voltage levels. The circuit 100 may implement a simple design that may not require additional design overhead when ported from one design to another. The circuit 100 may not be dependant upon a specific regulated voltage level. The PLL 106 on an IC may have several regulated supplies that are generated using the same reference voltage signal (e.g., NGATE) as the core regulator.

The PLL 106 may contain a mixture of high-voltage (3.3V) thick-oxide devices and low-voltage (1.8V) thin-oxide devices. The fast, transient, switching conditions in the core 104 may appear to be DC when averaged over time. Internal resistance drops in the core may raise a level of the core ground supply (VGND) and consequently, the reference voltage NGATE that is generated in reference to VGND. Without the switch 110, the increase in potential is then generally coupled to the PLL 106, raising the supply of the low-voltage device to levels that could stress the gate oxide to the point of breakdown.

For a single IC implementation, the switch 110 may be gated by the power down signal PD and placed between the core 104 and PLL 106 grounds (VGND and VGNDPLL respectively). The switch 110 may allow a net increase in voltage across the gate oxide of the PLL 106 devices to be zero. The circuit 100 may improve device reliability in mixed voltage designs.

The circuit 100 may allow the low-voltage, thin-oxide, regulated devices in a PLL to have increased margin so as not to suffer from excess gate-oxide stress. The circuit 100 may provide a simple and efficient design. The circuit 100 may not require an additional regulator for the PLL 106 to operate properly. Therefore, the circuit 100 may save die size over the use of an additional regulator. The alternate implementation of FIG. 4 may require a number of switches equal to the number of regulated supplies of the circuit 106'''. In one example, three switches are needed when there are three supplies.

The present invention may provide a circuit and method for connecting disjoint supplies on chip when part of the circuitry is powered down. The present invention may provide a circuit and method for reducing gate oxide stress of powered down circuitry. The circuit 100 may reduce the voltage across powered down circuitry. The circuit 100 may control regulated supply voltage levels in mixed voltage level, regulated designs. The circuit 100 may implement a switched clamping device for connecting disjoint supplies.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to (i) receive a first supply voltage and (ii) be coupled to a first ground, wherein said first supply voltage is controlled by a reference voltage;
   a second circuit configured to (i) receive a second supply voltage and (ii) be coupled to a second ground, wherein said second supply voltage is controlled by said reference voltage and said second circuit is configured to be disabled in response to a control signal; and
   a switch coupled between said first and second circuits, wherein said switch is configured to connect said first and second circuits when said second circuit is disabled.

2. The circuit according to claim 1, further comprising:
   a regulator circuit configured to generate said reference voltage.

3. The circuit according to claim 1, wherein said reference voltage is presented to said second circuit through a resistor.

4. The circuit according to claim 1, wherein said second circuit comprises an oscillator circuit.

5. The circuit according to claim 1, wherein said second circuit comprises a phase lock loop (PLL) circuit.

6. The circuit according to claim 1, wherein said switch is coupled between said first and second grounds.

7. The circuit according to claim 1, wherein said switch is coupled between said first and second supply voltages.

8. The circuit according to claim 1, wherein said circuit is configured to reduce a gate oxide stress of said second circuit.

9. The circuit according to claim 1, wherein said circuit is further configured to reduce a voltage level across said second circuit when said first circuit has quick internal switching.

10. The circuit according to claim 1, wherein:
    said first supply voltage is generated in response to said reference voltage and a second switch; and
    said second supply voltage is generated in response to said reference voltage and a third switch.

11. The circuit according to claim 1, wherein said second circuit receives a plurality of second supply voltages.

12. The circuit according to claim 11, wherein a plurality of second supply voltages are generated in response to said reference voltage and a plurality of third switches.

13. The circuit according to claim 1, wherein said switch comprises a clamp circuit.

14. The circuit according to claim 1, further configured to prevent damage to one or more thin oxide devices in said second circuit.

15. The circuit according to claim 1, wherein said circuit is further configured to provide an increased margin.

16. An apparatus comprising:
    first means for (i) receiving a first supply voltage and (ii) being coupled to a first ground, wherein said first supply voltage is controlled by a reference voltage;
    second means for (i) receiving a second supply voltage and (ii) being coupled to a second ground, wherein said second supply voltage is controlled by said reference voltage and second means is configured to be disabled in response to a control signal; and
    third means coupled between said first and second means, wherein said third means is configured to connect said first and second means when said second means is disabled.

17. A method for reducing gate oxide stress in low-voltage regulated devices comprising the steps of:
    (A) receiving a first supply voltage controlled by a reference voltage and presented to a first circuit;

(B) receiving a second supply voltage controlled by said reference voltage and presented to a second circuit, wherein said second circuit is configured to be disabled in response to a control signal; and (C) connecting said first and second circuits when said second circuit is disabled.

18. The method according to claim 17, wherein step (C) connects said first and second circuits through a first ground of said first circuit and a second ground of said second circuit.

19. The method according to claim 17, wherein:

said first supply voltage is generated in response to said reference voltage and a second switch; and said second supply voltage is generated in response to said reference voltage and a third switch.

20. The method according to claim 17, wherein said second circuit receives a plurality of second supply voltages.

* * * * *